United States Patent [19]
Zuehlke et al.

[11] Patent Number: 5,736,795
[45] Date of Patent: Apr. 7, 1998

[54] SOLID STATE AC SWITCH WITH SELF-SYNCHRONIZING MEANS FOR STEALING OPERATING POWER

[75] Inventors: Kurt G. Zuehlke, Minnetonka; Steven H. Lein, Bloomington, both of Minn.

[73] Assignee: Honeywell Inc., Minneapolis, Minn.

[21] Appl. No.: 635,831

[22] Filed: Apr. 22, 1996

[51] Int. Cl.$^6$ ................................................. H03K 5/153
[52] U.S. Cl. ........................... 307/130; 307/38; 307/39; 307/52; 307/125; 361/13; 361/60
[58] Field of Search ........................ 307/45, 116, 52, 307/112, 125, 130, 39; 361/13, 60; 323/237; 327/87, 537

[56] References Cited

U.S. PATENT DOCUMENTS

| | | | |
|---|---|---|---|
| 4,039,867 | 8/1977 | Blumberg et al. | 326/127 |
| 4,210,830 | 7/1980 | Fukahori | 327/87 |
| 5,218,235 | 6/1993 | Patterson et al. | 307/39 |
| 5,523,547 | 6/1996 | Miller | 219/202 |
| 5,604,424 | 2/1997 | Shuttleworth | 323/258 |

*Primary Examiner*—William M. Shoop, Jr.
*Assistant Examiner*—Albert W. Paladini
*Attorney, Agent, or Firm*—Charles L. Rubow

[57] ABSTRACT

A solid state power switching circuit for alternating current loads, in which operating power for the circuit is diverted from the switched current during power stealing intervals self-synchronized with the alternating current waveform. During periods in which current to the load is commanded, a load current switch is maintained in a low impedance state except for the duration of a short power stealing interval each half-cycle of the supplied alternating current. Self-synchronization is achieved with a current detector which senses whether or not the magnitude of the current diverted during each power stealing interval exceeds a current threshold, and pulse generator logic which shifts the power stealing intervals in time relative to the alternating current waveform in response to the previously sensed current magnitude.

16 Claims, 2 Drawing Sheets

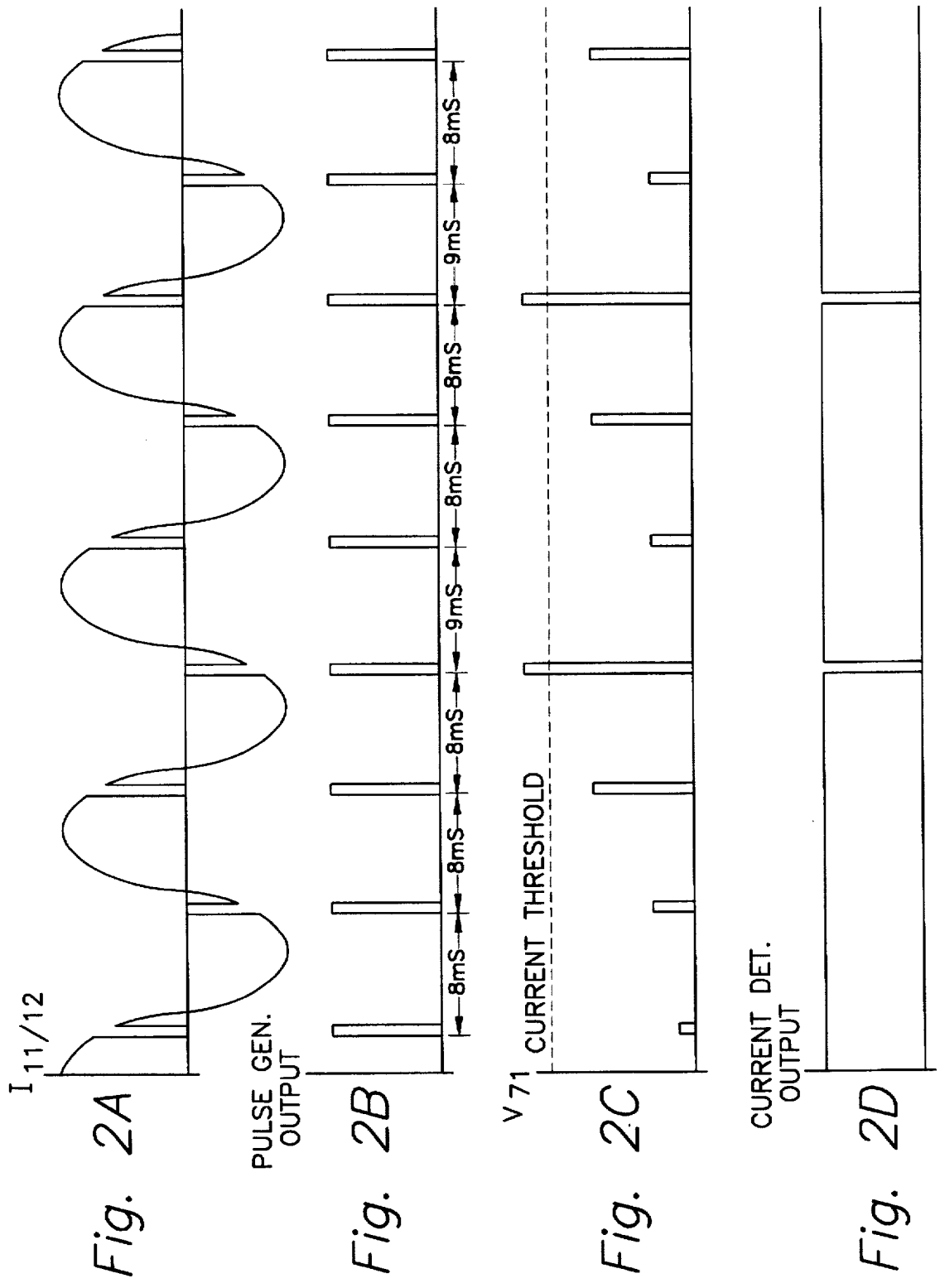

1

SOLID STATE AC SWITCH WITH SELF-SYNCHRONIZING MEANS FOR STEALING OPERATING POWER

BACKGROUND OF THE INVENTION

The present invention relates generally to solid state switching apparatus for controlling the supply of alternating electric current to a load, and more particularly to a method and apparatus for diverting from the supplied alternating current in a self-synchronizing manner the power required for operation of the switching apparatus.

With advances in solid state power switching technology, it has become increasingly common to replace mechanical power control switches with the solid state switches to achieve long life, quiet operation, and other advantages. However, solid state switches and the associated control circuitry require electric power for operation, which is a disadvantage in certain applications. For example, an important application for the present invention is in replacement of a conventional thermostat having a bi-metal sensor. In conventional bi-metal thermostats, it has not been necessary to provide external operating power for achieving on-off action of the switch. In replacing such a control with one utilizing solid state power switching components, it is disadvantageous, and may be difficult to wire in additional power required for circuit operation. There are also obvious disadvantages to employing a battery for providing the operating power. A solution which has become preferred is to "steal" the necessary operating power from the power which is being switched.

One of the solid state switching components which is most adaptable for alternating current applications is a power field effect transistor (FET). This component requires very little power for performing its control function. While single FET's are available which can switch alternating current, they typically have been expensive or have marginal capability to provide reasonably high blocking voltages in the off-state and low impedance in the on-state. These disadvantages can be overcome by employing two unidirectional low cost power FET's connected in a series back-to-back configuration. In this manner, good voltage blocking capability is provided for both polarities of supplied alternating current, one providing blocking during half cycles of one polarity and the other providing blocking during half cycles of the opposite polarity.

During periods in which the switching device is in a high impedance "open switch" state, it is relatively easy to steal the required operating power, since there is ample voltage across the device. However, during periods in which the device is in a low impedance "closed switch" state, essentially no voltage is available across the device, and stealing operating power becomes much more difficult.

One known approach to stealing power during periods in which the switching device is in a low impedance state involves the use of an in-line current transformer. Such an approach requires provisions for implementing two separate power stealing techniques, one for intervals during which the switching device is in its high impedance state, and another for intervals during which it is in its low impedance state.

Another approach involves controlling the switching device to its high impedance state for short intervals during periods that the load is otherwise to be powered, and diverting power during such short intervals to a storage capacitor. Where the power is supplied in the form of alternating current, it is preferable to synchronize the short

2 power diversion intervals with the alternating current waveform. Synchronization may be accomplished by means of circuitry including a zero crossing detector. However, zero crossing detectors typically require sensitive analog components which both add expense to the control circuit, and require space which may not be available.

The applicants have devised a method and apparatus for accomplishing power stealing from conductors carrying alternating current both when a switching device between the conductors is in conducting and non-conducting states in a manner which is self-synchronized with the alternating current, thereby avoiding the disadvantages of prior power stealing techniques. Self-synchronized power stealing according to the applicants' method may be readily accomplished with apparatus which is simple, involves minimum circuitry and is inexpensive to implement.

SUMMARY OF THE INVENTION

The present invention is a method and apparatus for controlling the supply of alternating current to a load by means of a solid state switching circuit incorporating circuitry for stealing operating power from the switched current in a manner which is self-synchronized with alternation of the current. During periods in which powering of the load is commanded, the switching circuit is controlled to its high impedance state for brief power stealing intervals, successive intervals occurring during separate equally spaced half cycles of alternating polarity of the alternating current. If the magnitude of the diverted current is less than a predetermined threshold, a succeeding power stealing interval is shifted in time toward the current peak of its associated supply current half cycle. If the magnitude of the diverted current exceeds the threshold, a succeeding power stealing interval is shifted in time away from the current peak of its associated supply current half cycle. The amounts by which power stealing intervals are shifted in time are preferably unequal for diverted current magnitudes of less than and greater than the predetermined threshold, one being twice the duration of the other, whereby balanced power stealing from opposite phases of the supplied alternating current can be achieved.

The diverted current is used to charge a power storage device which supplies operating power for the circuit. A current limiter may be provided to limit the current furnished to the power storage device during periods in which no power to the load is commanded.

BRIEF DESCRIPTION OF THE DRAWINGS

FIG. 2 is a representation of operating waveforms which occur at selected points in the circuit of FIG. 1, illustrating the manner in which power stealing intervals are shifted in response to magnitude of the diverted current.

DESCRIPTION OF THE INVENTION

Figure 1:
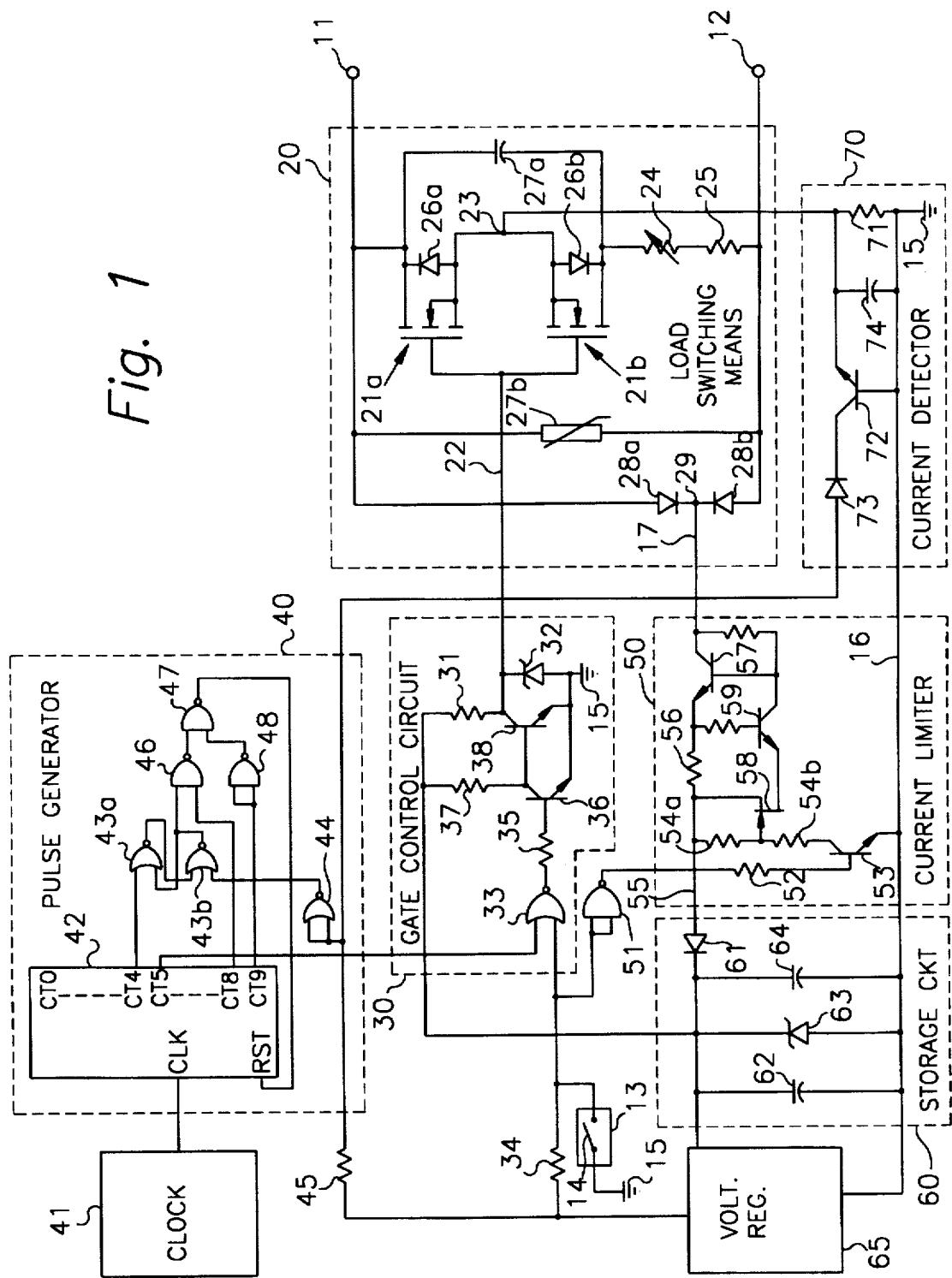
FIG. 1 is a schematic diagram of a preferred circuit for implementing the applicants' invention.

In the schematic diagram of FIG. 1, reference numerals 11 and 12 identify a pair of terminals to which an alternating current electrical load (not shown) may be connected for control in response to a load control signal provided by an input device generally identified by reference numeral 13. Input device 13 is schematically represented as including a switch 14, of which the pole is connected to a source of reference potential or ground 15. In a representative application, and for convenience in describing the applicants' invention, input device 13 may be considered a thermostat in which switch 14 is responsive to the difference between a setpoint temperature provided by an operator and a measured temperature in a space whose temperature is to be controlled. In such an application the load connected between terminals 11 and 12 might be the winding of a cooling relay connected in series with the secondary winding of a 120/24 volt transformer.

Switch 14 is open when there is no demand for cooling in the space. Upon a call for cooling, switch 14 closes to provide a corresponding control signal to a solid state load switch generally identified by reference numeral 20. The control signal is produced by a gate control circuit 30 connected between input device 13 and load switch 20. Gate control circuit 30 also receives a train of pulses from a pulse generator 40, which the gate control circuit logically combines with the load control signal from input device 13 to produce the control signal for load switch 20.

Gate control circuit 30 and pulse generator 40, as well as certain other functional components require electrical power at a specified voltage, typically five volts DC, for operation. In addition, as discussed hereinafter, gate control circuit 30 requires a supply of typically 12 volts DC to produce the control signal required for proper operation of the power switching elements preferred for use in load switch 20. Operating power at these voltages is diverted from the switched current at power terminals 11 and 12, and supplied through a current limiter 50 to a storage circuit 60 which supplies the higher operating voltage required by gate control circuit 30. Storage circuit 60 also serves as the supply for a voltage regulator 61, preferably implemented as a switching power supply circuit, which furnishes the required lower operating voltage.

For several reasons it is important to minimize the power diverted from the switched current to the control circuitry. One reason is that any power diverted from the switched current increases the effective voltage drop across load switch 20 when the load switch is in its low impedance state, and increases effective bleed current (leakage) when the load switch is in its high impedance state. The less the diverted power, the greater the range of load currents which can be effectively switched without affecting operation of the controlled load. Conversely, power diverted to operation of the control circuit is dissipated in the form of heat. This contributes to an offset temperature error which is particularly disadvantageous in thermostat applications. Minimizing the power diverted to control circuit operation minimizes heat dissipation requirements, thereby permitting a control package of minimum size.

The present invention advantageously employs a current detector 70 in combination with pulse generator 40 to ensure that during periods in which power to the load is commanded, the stolen power is maintained at a consistent predetermined level. As will be described hereinafter, this combination generates a train of pulses used to produce corresponding short power stealing intervals, the timing of individual pulses and power stealing intervals relative to the supply current waveform being varied to provide for diversion of just sufficient power to permit proper operation of the control circuitry.

Turning to the specifics of a preferred implementation of the present invention, load switch 20 is illustrated as including a pair of ideally identical N-channel power FET's 21a and 21b connected in a back-to-back configuration between power terminals 11 and 12. FET's 21a and 21b either permit or block current flow between power terminals 11 and 12 in response to a control signal on a control signal conductor 22. In this connection, it should be noted that although field effect transistors in general consume very little operating power, currently available low cost power FET's require a control voltage of at least nine volts, and preferably 12 volts, to achieve a solid low impedance "on" state.

Each of FET's 21a and 21b has source and drain power electrodes and a gate electrode, the source electrodes being connected together at a junction 23 and the gate electrodes being connected to conductor 22. The drain electrodes of FET's 21a and 21b are connected to power terminals 11 and 12, respectively. The connection between the drain electrode of FET 21b and power terminal 12 includes an over-current protection feature in the form of series connected resistive elements 24 and 25. Resistive element 24 is a very high temperature coefficient resistor known as a PolySwitch®, commercially available from Raychem Corp. Resistive elements 24 and 25 act to protect FET's 21a and 21b in the event of excessive current through the FET's, which, for example, may result from a field installation wiring error. Resistive element 25 limits the peak current to a value that the FET's can tolerate for a few seconds, by which time the resistance of resistive element 24 has increased through self-heating so as to decrease the current to a value the FET's can tolerate indefinitely.

Reference numerals 26a and 26b identify body diodes between the source and drain electrodes of FET's 21a and 21b, respectively. The body diodes are oppositely poled, with their anodes at the source electrodes which are connected together at junction 23. Transient protection is provided by a capacitor 27a shown connected between the drain electrodes of FET's 21a and 21b, and a metal oxide varistor shown connected between power terminals 11 and 12.

In a typical heating and cooling system application the current source for powering a load connected to power terminals 11 and 12 supplies alternating current at 60 cycles per second and a nominal voltage of 24 volts. This is converted to direct current for operating the control circuitry by means of a full wave rectifier bridge comprising body diodes 26a and 26b and an additional pair of diodes 28a and 28b. The anodes of diodes 28a and 28b are connected to power terminals 11 and 12, respectively. The cathodes of diodes 28a and 28b are connected together at a junction 29, through which unidirectional current is provided over a current supply conductor 17. The return for the DC operating supply circuit is provided by connecting junction 23 to ground 15 and reference potential conductor 16 through current detector circuit 70.

In operation, control signal conductor 22 is biased to a voltage suitable for maintaining FET's 21a and 21b in a low impedance state by means of voltage provided by storage circuit 60 through a bias resistor 31. A zener diode 32 is connected between conductor 22 and ground 15 to limit the maximum voltage applied to the gates of FET's 21a and 21b. FET's 21a and 21b are switched to a high impedance state, as will be described hereinafter, by overcoming the bias voltage on conductor 22 when switch 14 is open or when a pulse is received from pulse generator 40.

The signals from switch 14 and pulse generator 40 are combined by means of a NOR logic element 33. A first input to logic element 33 is biased to a "high" state by means of voltage supplied by voltage regulator 61 through a resistor 34. Closure of switch 14, corresponding to a command for power to the load results in changing of that input signal to a "low" state. With switch 14 open, logic element 33 provides a "low" output which is supplied through a resistor 35 to the base of an NPN transistor 36 whose collector is supplied with the output voltage of storage circuit 60 through a resistor 37, and whose emitter is connected to ground 15. A "low" output from logic element 33 renders transistor 36 non-conductive. The voltage at the collector of transistor 36 is supplied to the base of an NPN transistor 38 whose collector is supplied with the output voltage of storage circuit 60 through resistor 31, and whose emitter is connected to ground 15. With transistor 36 in a non-conductive state, transistor 38 remains conductive by virtue of the voltage supplied to its base through resistor 37. This reduces the voltage on control signal conductor 22 which renders FET's 21a and 21b non-conductive.

Conversely, a closed state of switch 14 in the absence of a pulse from pulse generator 40 results in a "high" output from logic element 33, conduction of transistor 36 and non-conduction of transistor 38. This biases the gates of FET's 21a and 21b to a voltage which maintains the FET's in a low impedance state, and results powering of the load connected to power terminals 11 and 12.

When switch 14 is open, pulses from pulse generator 40 have no effect on the output of logic element 33, and hence, no effect on the voltage on control signal conductor 22. However, when switch 14 is closed, corresponding to a command for power to the load and requiring a low impedance state of FET's 21a and 21b, pulses supplied by pulse generator 40 result in corresponding power stealing intervals during which FET's 21a and 21b are switched to their high impedance states. FIG. 2A illustrates the load current waveform with a power stealing interval each half cycle of the supplied current.

Pulse generator 40 is connected to receive a clock signal from a clock circuit 41. For a supply current frequency of 60 cycles per second, a 1 kHz clock pulse repetition rate would be ideal. This ideal can be satisfactorily approximated in a simple low cost manner with a standard time keeping clock circuit implemented with a 32.768 kHz crystal oscillator and divider which can readily produce a clock pulse repetition rate of 1.024 kHz. For convenience, the following description will assume and be based on an ideal 1 kHz clock signal.

The clock signal is supplied to the CLK pin of a decade counter 42 which sequentially produces output pulses of one millisecond duration at output pins CT0 through CT9. Decade counter 42 also has a reset pin which requires a "low" signal for continued operation of the counter. Interruption of the "low" signal terminates the counting sequence, and causes pulse generation to start over at pin CT0.

The pulses produced at selected output pins are used for various purposes. Specifically, pulses at pin CT4 are used to reset a flip flop comprising cross-coupled NOR logic elements 43a and 43b prior to generation of a power stealing pulse. Pulses at pin CT5 are used to enable a power stealing pulse and a current sampling interval for current detector 70. Pulses at pins CT8 or CT9 are used to reset the operation of counter 42 based on the state of certain additional logic in pulse generator 40 which causes reset of counter 42 after a pulse at pin CT8 or CT9 based on the status of flip-flop 43a, 43b.

Pulses at pin CT4 of counter 42 are supplied to one input of logic element 43a which serves as a reset input of flip flop 43a, 43b. The set input of flip flop 43a, 43b formed by one input terminal of logic element 43b is connected to the output of a NOR logic element 44 connected as an inverter. Both inputs of logic element 44 are biased "high" by voltage provided from voltage regulator 65 through a resistor 45, thereby causing a "low" output from the logic element except when the inputs to the element are pulled "low" in response to detection of diverted current in excess of a threshold magnitude.

In the absence of a "high" output from logic element 44, the output from flip flop circuit 43a, 43b remains "high". This output is supplied to one input of a NAND logic element 46 having a second input which receives pulses from pin CT8 of decade counter 42. The output of NAND element 46, accordingly, remains "high" except during a pulse from pin CT8. This output is supplied to one input of a NAND logic element 47 having a second input connected to the output of a NAND logic element 48 connected as an inverter, with both of its inputs connected to receive pulses from pin CT9 of decade counter 42. Accordingly, the output of NAND element 48 remains high except during pulses from pin CT9.

Under these conditions, the output of NAND element 47 goes "high" during a pulse from output pin CT8 of decade counter 42. The output of NAND element 47 is connected to the reset pin of decade counter 42. A positive going pulse from logic element 47 serves to reset decade counter 42, thereby establishing a first repetition rate and pulse spacing for the output pulse train produced at output pin CT5. For the stated ideal 1 kHz clock signal, this results in an output pulse train having a pulse period or spacing of eight milliseconds.

Detection of current in excess of a threshold magnitude diverted from the load to the control circuitry results in the inputs of NOR element 44 being drawn "low". This sets the output of flip flop 43a, 43b "low", which results in "high" output from NAND element 46 irrespective of pulses received from pin CT8 of decade counter 42. As a result, the output of NAND element 47 goes "high" during pulses received from pin CT9 which serves to reset decade counter 42 at intervals of nine milliseconds, resulting in a pulse train from pin CT5 having pulse period or spacing of nine milliseconds.

A representative output pulse train of pulse generator 40 is illustrated in FIG. 2B. The first four pulses of this pulse train are equally spaced at eight milliseconds, as might occur during start-up of the switching circuit. The timing of the first pulse relative to the supplied current waveform is arbitrarily shown as occurring near a zero crossing, which results in the diverted current (represented by the voltage across resistor 71) having a magnitude well below the predetermined threshold magnitude as illustrated in FIG. 2C, and a "high" input to NOR logic element 44. Accordingly, pulse generator 40 produces its next output pulse in eight milliseconds, which is slightly less than the 8.33 millisecond duration of a half cycle of the 60 cycle per second supply current. Thus, the next power stealing interval is slightly shifted in time toward the current peak of the next half cycle of supply current. The magnitude of the current diverted during this power stealing interval, although greater than that during the first power stealing interval, still does not reach the predetermined current threshold. Accordingly, the spacing of the next pulse remains at eight milliseconds which moves the corresponding power stealing interval yet closer to the current peak of the next half cycle of the supply current. The magnitude of the diverted current is again less than the current threshold which results in an eight millisecond spacing to the next power stealing interval, and another shift of the power stealing interval toward the current peak.

This time, the magnitude of the diverted current exceeds the current threshold as illustrated in FIG. 2C, and current detector 70 supplies a "low" input to NOR logic element 44 which results in an increase to nine milliseconds for the spacing to the next pulse. Thereafter, the pulses and power stealing intervals continue to occur in a nominal eight millisecond-eight millisecond-nine millisecond sequence, the eight millisecond spacing being shorter than the duration of a half cycle of the supply current by one-third of a millisecond, and the nine millisecond spacing being greater than the duration of a half cycle of the supply current by two-thirds of a millisecond.

Current detector 70, which provides the pulse period control signal as illustrated in FIG. 2D to pulse generator 40, includes an NPN transistor 72 connected through its base and emitter electrodes across resistor 71. Resistor 71 is a low resistance (typically 2–4 ohms) resistor through which the diverted current passes during power stealing intervals. The collector of transistor 72 is connected to the inputs of NOR logic element 44 through a diode 73 oriented with its cathode connected to the collector of the transistor. A capacitor 74 connected across resistor 71 serves to augment the current detection voltage produced across the resistor.

If the current through resistor 71 is sufficient to generate approximately 0.5 volts across the resistor, then transistor 72 becomes conductive. This causes the voltage on the collector of transistor 72 to go to the same voltage as on its emitter, which is slightly (approximately 0.6 volts) more negative than the control circuit reference potential or ground 15. Diode 73 in series with the collector of transistor 72 acts to drop this 0.6 volts so as to pull the voltage at the inputs of NOR logic element 44 to a logic "low" of not less than the control circuit reference potential.

As previously indicated, portions of the control circuit including gate control circuit 30, pulse generator 40 and current detector 50 require operating current at one or both of the output voltages of storage circuit 60 and voltage regulator 65. Storage circuit 60 is supplied with current diverted from the load through current limiter 50. During periods in which power to the load is commanded, the diverted current is controlled by shifting the power stealing intervals relative to the supplied current waveform as previously described, and no further current limiting is required. However, this current limiting mode is not available during periods that no power to the load is commanded. Accordingly, current limiter 50 is configured and connected to be enabled only when no power to the load is commanded. This insures that current stolen from the current supply when no power to the load is commanded will not be sufficient to inadvertently operate the load.

The enable/disable signal for current limiter 50 is provided by switch 14 through a NAND logic element 51 connected as an inverter. With switch 14 open, a "high" signal is provided to both inputs of logic element 51 which results in a "low" output from the element.

This signal is supplied through a resistor 52 to the base electrode of an NPN transistor 53 whose emitter is connected to ground 15 and whose collector is connected through voltage dividing resistors 54a and 54b to a conductor 55 through which current is supplied to storage circuit 60. Conductor 55 is connected to junction 29 through a resistor 56 and the emitter-collector electrodes of an NPN transistor 57. A voltage corresponding to a "low" logic signal at the base of transistor 53 causes the transistor to be non-conductive, which raises the voltage at the junction of resistors 54a and 54b to the voltage on conductor 55.

The junction between resistors 54a and 54b supplies a gate signal to a FET 58 connected through its source and drain electrodes between conductor 55 and the emitter of an NPN transistor 59 whose base electrode is connected through a resistor to the junction between resistor 56 and the emitter of transistor 57. With transistor 53 in a non-conductive state, no voltage is generated across resistor 54a, and FET 58 remains conductive. In that situation, if there is sufficient current through resistor 56 to generate approximately 0.6 volts thereacross, then transistor 59 becomes conductive, and reduces the current through the base electrode of transistor 57, thereby reducing the pass current through the transistor to regulate the current available through conductor 55.

The current carried by conductor 55 passes through a diode 61 and charges an energy storage capacitor 62. Diode 61 prevents discharge of capacitor 62 back through the charging circuit during intervals of low voltage supplied by the charging circuit. A zener diode 63 connected across capacitor 62 limits the voltage thereacross to the voltage desired from storage circuit 60. A small capacitor 64 also connected in parallel with capacitor 62 provides high frequency filtering.

The voltage available from storage circuit 60 is supplied to gate control circuit 30, as previously described. Current at the same voltage is provided to voltage regulator 65 which reduces the voltage to five volts as required by gate control circuit 30, pulse generator 40 and current detector 70. Accordingly, the operating power for the complete solid state power switching apparatus is obtained from the current being switched, and no auxiliary operating power supply arrangement is required. Storage circuit 60 may also serve to supply operating power for other components and circuits not shown.

As illustrated in FIGS. 2A–2D, the circuit of FIG. 2 diverts power in synchronism with the waveform of the supplied current while varying the timing of individual power stealing intervals to maintain the diverted power at a desired level. Power is diverted during power stealing intervals having a fixed duration and one of two pulse repetition periods, where the period selected depends on whether a predefined level of current was measured during the previous power stealing interval. In this manner, the timing of the power stealing intervals relative to the supplied current waveform is continually adjusted to control the amount of power stolen from the current supply. The use of timing shifts of minus one delta and plus two delta advantageously prevents more energy from consistently being diverted from one phase of the alternating current than from the other phase. The minus one delta—minus one delta—plus two delta timing shift sequence results in a power stealing pattern which repeats every three half cycles of the supplied alternating current, thereby providing an inherently balanced diversion of operating power from the supplied current.

It should be noted that the present power stealing method is not limited to the specifically illustrated pattern of power stealing intervals. The method is self-synchronizing so long as, upon detection of diverted current less than the current threshold, a succeeding interval is shifted in time toward the current peak of the corresponding supply current half cycle, and, upon detection of diverted current greater than the current threshold, a succeeding interval is shifted in time away from the current peak of the corresponding supply current half cycle. Further, diversion of power is inherently phase balanced so long as successive power stealing intervals occur during equally spaced supply current half cycles of alternating polarities. Finally, the amount of power stolen is dependent on duration as well as timing of the power stealing intervals. Thus, the present method encompasses and may be implemented in an arrangement which varies both duration and timing of the power stealing intervals.

Although a particular embodiment of apparatus employing the applicants' power stealing method is shown and described for illustrative purposes, variations of the method as well as variations in the apparatus for carrying out the method will be apparent to those of ordinary skill in the relevant arts. It is not intended that the scope of coverage be limited to the illustrated embodiment, but only by the terms of the following claims.

The embodiments of the invention in which an exclusive property or right is claimed defined as follows:

1. In apparatus for controlling the supply of alternating electric current to a load, circuitry for stealing electric power from the supplied current comprising:

first and second power terminals between which a source of alternating current at a predetermined frequency and a load in series with the source may be connected;

switching means connected between said first and second power terminals for selectively permitting current to flow through the load in response to a control signal of at least a first voltage magnitude, said switching means having a low impedance state in which current flow is permitted and a high impedance state in which current flow is substantially blocked;

rectification means connected between said first and second power terminals for receiving alternating current and converting it to unidirectional current at a voltage of at least the first voltage magnitude for supply through first and second output terminals;

a reference potential conductor;

a current supply conductor;

a current detector connecting one of the first and second output terminals of said rectification means to one of said reference potential conductor and said current supply conductor, said current detector being operable to produce a current threshold signal indicative of whether the magnitude of the current supplied by said rectification means exceeds a predetermined threshold;

first connecting means connecting other of the first and second output terminal of said rectification means to the other of said reference potential conductor and said current supply conductor, whereby said current supply conductor is normally maintained at a voltage of at least the first voltage magnitude relative to the voltage on said reference potential conductor;

electric power storage means connected between said reference potential conductor and said current supply conductor, said electric power storage means being operable to store power when the voltage between said first and second power terminals exceeds a predetermined magnitude;

a pulse generator operable to generate a pulse train in which successive pulses occur during separate equally spaced half cycles of alternating polarity of the supplied alternating current, the timing of individual pulses within their respective associated half cycles of the supplied alternating current being variable in response to the current threshold signal such that if a current magnitude in excess of the predetermined threshold is indicated, a succeeding pulse is shifted in time away from the current peak of the supplied alternating current, and if a current magnitude less than the predetermined threshold is indicated, a succeeding pulse is shifted in time toward the current peak of the supplied alternating current;

input means for supplying a load power signal commanding that current be supplied to the load; and control circuitry connected to receive operating power through said current supply conductor, said control circuitry being responsive to the load power signal and the pulses produced by said pulse generator to supply control signals to said switching means such that in the presence of a load power signal said switching means is maintained in its low impedance state except during individual pulses produced by said pulse generator.

2. The apparatus of claim 1 wherein said pulse generator is operable to generate pulses at a first repetition period of less than one-half the duration of a cycle of the supplied alternating current in response to a current threshold signal indicating a current magnitude less than the predetermined threshold, and at a second repetition period of between the durations of one-half and a full cycle of the supplied alternating current in response to a current threshold signal indicating a current magnitude greater than the predetermined threshold.

3. The apparatus of claim 2 wherein:

said switching means comprises first and second power field effect transistors connected in a back-to-back arrangement, each having source and drain electrodes, a gate electrode and a body diode between the source and drain electrodes, the source electrodes of said first and second power field effect transistors being connected at the first output terminal; and first and second oppositely poled diodes are connected in series between said first and second power terminals, the second output terminal being formed at the connection between said first and second diodes, the combination of said first and second diodes being poled oppositely from the combination of the body diodes in said first and second power field effect transistors to form a full wave rectifier for providing the unidirectional current through the first and second output terminals.

4. The apparatus of claim 3 wherein:

the first and second repetition periods of the pulses generated by said pulse generator are substantially eight milliseconds and nine milliseconds, respectively; and the pulses generated by said pulse generator have a substantially constant duration.

5. The apparatus of claim 4 wherein said first connecting means includes a current limiter responsive to the load power signal to limit current through said current supply conductor when no supply of current to the load is commanded.

6. The apparatus of claim 5 wherein said control circuitry includes:

biasing means for supplying the gate electrodes of said first and second power field effect transistors with a bias voltage of at least the first voltage magnitude; and means for overcoming the bias voltage during individual pulses produced by said pulse generator.

7. The apparatus of claim 6 wherein:

at least one of said current detector, said pulse generator and said control circuitry requires direct current at a second voltage less than the first voltage for operation; and a voltage regulator is provided, said voltage regulator being connected to receive power from said current supply conductor, and operable to supply current at the second voltage to said at least one of said current detector, said pulse generator and said control circuitry.

8. In apparatus for controlling the supply of alternating electric current to a load, the alternating current being of a known frequency and the apparatus including a switch controllable to low and high impedance states for respectively permitting and effectively blocking the flow of current to the load, a method for stealing electric power from the controlled supply of current during periods when current to the load is called for, comprising the steps of:

diverting a portion of the electric current which would otherwise flow through the switch, diversion being possible only when voltage of at least a predetermined magnitude exists across the switch;

controlling the switch to a high impedance state for a power stealing interval during each of equally spaced half cycles of alternating polarity of the alternating electric current;

determining whether the magnitude of the diverted current reaches a predetermined threshold;

shifting timing of succeeding power stealing intervals to a portion of the half cycles of the alternating current characterized by higher instantaneous current if the magnitude of the diverted current is less than the predetermined threshold; and shifting timing of succeeding power stealing intervals to a portion of the half cycles of the alternating current characterized by a lower instantaneous current if the magnitude of the diverted current exceeds the predetermined threshold.

9. The method of claim 8 wherein a power stealing interval occurs each half cycle of the alternating current, and the power stealing intervals have either of first and second repetition periods, the first repetition period being shorter than the duration of a half cycle of the alternating current, and the second repetition period being between the durations of a half cycle and a full cycle of the alternating current.

10. The method of claim 9 wherein:

the alternating current has a nominal frequency of sixty cycles per second, corresponding to a half cycle duration of substantially 8.33 milliseconds;

the power stealing intervals are of predetermined substantially constant duration; and the first and second repetition periods are substantially eight milliseconds and nine milliseconds, respectively.

11. The method of claim 10 wherein means is provided for discontinuing the power stealing intervals when no supply of current to the load is called for.

12. Self-powered electronic switching apparatus for controlling the supply of alternating current to a load comprising:

first and second power terminals;

first and second substantially identical power field effect transistors, each having source and drain power electrodes, a gate electrode and a body diode between the source and drain power electrodes;

first connecting means connecting said first and second power field effect transistors in a back-to-back arrangement between said first and second power terminals, a pair of corresponding power electrodes of said first and second power field effect transistors being connected at a first junction;

a reference potential conductor;

second connecting means connecting said first junction to said reference potential conductor;

first and second diodes connected in series in an oppositely poled arrangement between said first and second power terminals, said first and second diodes being connected at a second junction, and, together with the body diodes in said first and second power field effect transistors, forming a full-wave rectifier for producing a unipolar voltage between said first and second junctions;

a current supply conductor for supplying direct current at a first voltage;

third connecting means connecting the second junction to said current supply conductor;

a current detector operable to produce a current threshold signal indicative of whether the electric current flowing through said reference potential conductor and said current supply conductor exceeds a predetermined threshold;

pulse generator means responsive to the current threshold signal to produce a pulse train of a first repetition rate corresponding to a pulse spacing shorter than the duration of a half cycle of the supplied alternating current when the magnitude of the current detected by said current detector is less than the predetermined threshold, and of a second repetition rate corresponding to a pulse spacing between the durations of a half cycle and a full cycle of the supplied alternating current when the magnitude of the current detected by said current detector is at least as great as the predetermined threshold; and a gate control circuit requiring direct current at substantially the first voltage for operation, said gate control circuit being responsive to the pulse train produced by said pulse generator means and a signal indicative of a command for supply of current to the load, said gate control circuit further being operable to supply a gate signal to the gate electrodes of said first and second power field effect transistors effective to cause said first and second power field effect transistors to assume a low impedance state when supply of current to the load is commanded except during individual pulses received from said pulse generator means; and fourth connecting means connecting said current supply conductor to said gate current for supplying current at the first voltage said gate control circuit.

13. The self-powered electronic switching apparatus of claim 12 wherein said pulse generator means is operable to produce pulses having a predetermined substantially constant duration, a pulse spacing of substantially eight milliseconds if the magnitude of the current detected by said current detector is less than the predetermined threshold, and a pulse spacing of substantially nine milliseconds if the magnitude of the current detected by said current detector is at least as great as the predetermined threshold.

14. The self-powered electronic switching apparatus of claim 13 wherein said second connecting means includes said current detector.

15. The self-powered electronic switching apparatus of claim 14 wherein:

at least one of said current detector, said pulse generator and said gate control circuit requires direct current at a second voltage less than the first voltage for operation;

a voltage regulator is connected between said reference potential conductor and said current supply conductor for producing direct current at the second voltage; and fifth connecting means is provided for supplying direct current at the second voltage from said voltage regulator to said at least one of said current detector, said pulse generator and said gate control circuit.

16. The self-powered electronic switching apparatus of claim 15 wherein:

said third connecting means includes a current limiting circuit having a disable terminal, said current limiting circuit being operable to limit the current supplied by said third connecting means, and responsive to a signal at the disable terminal to disable its current limiting function; and means is provided for supplying a signal to the disable terminal when no supply of current to the load is commanded.

* * * * *

UNITED STATES PATENT AND TRADEMARK OFFICE
CERTIFICATE OF CORRECTION

PATENT NO. : 5,736,795
DATED : April 7, 1998
INVENTOR(S) : Zuehlke et al.

It is certified that error appears in the above-indentified patent and that said Letters Patent is hereby corrected as shown below:

Claim 1, line 28, after "connecting" (second occurrence), insert --the--.
Claim 1, line 29, delete "terminal" and insert --terminals--.

Signed and Sealed this

Second Day of February, 1999

Attest:

Attesting Officer

*Acting Commissioner of Patents and Trademarks*